United States Patent
Huang et al.

(10) Patent No.: US 9,130,583 B2
(45) Date of Patent: Sep. 8, 2015

(54) METHOD FOR FULL-DIGITAL RANDOM SAMPLING

(71) Applicant: UNIVERSITY OF ELECTRONIC SCIENCE AND TECHNOLOGY OF CHINA, Chengdu, Sichuan (CN)

(72) Inventors: Wuhuang Huang, Chengdu (CN); Kuojun Yang, Chengdu (CN); Houjun Wang, Chengdu (CN); Jun Jiang, Chengdu (CN); Hao Zeng, Chengdu (CN); Duyu Qiu, Chengdu (CN); Peng Ye, Chengdu (CN); Qinchuan Zhang, Chengdu (CN); Shulin Tian, Chengdu (CN)

(73) Assignee: University of Electronic Science and Technology of China, Chengdu (CN)

( * ) Notice: Subject to any disclaimer, the term of this patent is extended or adjusted under 35 U.S.C. 154(b) by 0 days.

(21) Appl. No.: 14/584,599

(22) Filed: Dec. 29, 2014

(65) Prior Publication Data

US 2015/0188560 A1    Jul. 2, 2015

(30) Foreign Application Priority Data

Nov. 26, 2014    (CN) .......................... 2014 1 0692582

(51) Int. Cl.
  *H03M 1/00*    (2006.01)
  *H03M 1/12*    (2006.01)
  *G06T 17/20*   (2006.01)
  *G06F 3/038*   (2013.01)
  *G06F 3/044*   (2006.01)

(52) U.S. Cl.
  CPC ............... *H03M 1/128* (2013.01); *G06F 3/038* (2013.01); *G06F 3/044* (2013.01); *G06T 17/20* (2013.01); *H03M 1/00* (2013.01); *H03M 1/12* (2013.01)

(58) Field of Classification Search
  CPC .......... H03M 1/00; H03M 1/12; G06T 17/20; G06F 3/038; G06F 3/044
  USPC .......... 341/122, 123, 120, 155; 345/423, 174, 345/157
  See application file for complete search history.

(56) References Cited

U.S. PATENT DOCUMENTS

| | | | |
|---|---|---|---|
| 4,855,968 A | 8/1989 | Shank | |
| 6,271,773 B1 * | 8/2001 | Kobayashi | ..................... 341/51 |
| 7,190,752 B2 | 3/2007 | Shake et al. | |
| 7,652,465 B2 | 1/2010 | Sullivan et al. | |

* cited by examiner

*Primary Examiner* — Joseph Lauture
(74) *Attorney, Agent, or Firm* — Oliff PLC (57) ABSTRACT

For the signal under acquisition which varies monotonically before and after the trigger time, a method for full-digital random sampling employs first sampled data before the trigger time and first sampled data after the trigger time to fit a curve, and obtains an intersection point of triggering level and the fitted curve, then, calculates the time interval between sampled data after the trigger time and the intersection point in the end, reconstructs the original signal, i.e. the signal under acquisition by a time interval of each acquisition. Thus, an analog trigger circuit and a time measurement circuit of conventional random sampling system can be eliminated, that simplifies the circuit design of data acquisition system and decreases its hardware complexity. Moreover, the higher sampling rate for the signal under acquisition is attained, and more waveform details are obtained.

3 Claims, 7 Drawing Sheets

Fig. 1

PRIOR ART

Fig. 2

PRIOR ART

METHOD FOR FULL-DIGITAL RANDOM SAMPLING

FIELD OF THE INVENTION

This application claims priority under the Paris Convention to Chinese Patent Application No. 201410692582.4, Filed Nov. 26, 2014, the entirety of which is hereby incorporated by reference for all purposes as if fully set forth herein.

The present invention relates to the field of data acquisition, more particularly to a method for full-digital random sampling.

BACKGROUND OF THE INVENTION

Data acquisition technology have been widely applied to various fields, such as electronic measurement, communication, radar, aerospace and industry. With the development of technology and engineering application, the complexity of application system increases, and the frequency of the signal under acquisition (a continuous-time and continuous-amplitude analog signal, also called as input signal of DAS) is much higher than ever, that demands data acquisition system to raise its sampling rate. However, subject to the performance of analog-to-digital converter (ADC), it is rather difficult to dramatically enhance the real-time sampling rate of data acquisition system (DAS) to acquire enough waveform information of the signal under acquisition, some waveform information of the signal under acquisition will be lost, leading to the distortion of reconstructed signal. To solve the problem of the distortion of reconstructed signal, random sampling is employed to obtain ultrahigh sampling rate waveform information of periodic signal through multiple sampling.

Random sampling, belonging to non-real-time sampling, is an equivalent sampling, which uses the randomness of sampling signal relative to the signal under acquisition and triggering event to obtain high sampling rate through multiple acquisition and data merging. In practice, considering the randomness of the time interval between the trigger time and the first sampling time after the trigger, Random sampling uses high precise time interval measurement to obtain the time interval, and then reconstruct the original signal i.e. the signal under acquisition with higher sampling rate on basis of the time interval of each acquisition. The process of acquiring, storing and reconstructing of the signal under acquisition is shown in FIG. 1.

Figure 1:
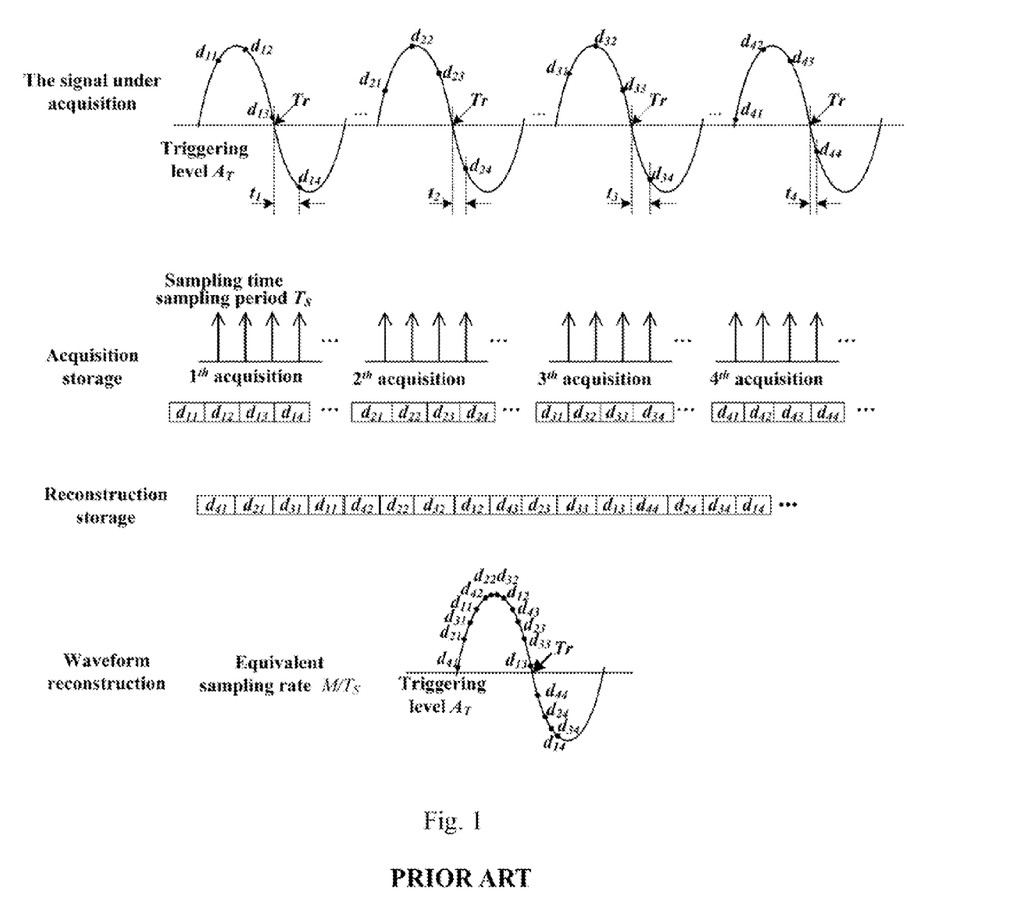
FIG. 1 is a diagram of the acquiring, storing and reconstructing of the signal under acquisition in conventional random sampling.

As shown in FIG. 1, random sampling employs sampling clock of period $T_s$ (sampling rate of ADC) to acquire the sampled data of the signal under acquisition multiple times (supposing the number of acquisition times is N), and multiple pluralities of sampled data $d_{ij}$ do are obtained, then stored in acquisition normal sequence (acquisition storage). Wherein, i is acquisition serial number and j is the sampled data sequence number. After the acquisition storage, there is reconstruction storage, the $i^{th}$ storage of sampled data is based on the time interval $t_i$ between trigger time $Tr_i$ of the $i^{th}$ acquisition and the first sampling time after the trigger of the $i^{th}$ acquisition. The waveform of the original signal, i.e. the signal under acquisition will be reconstructed with sampled data of the reconstruction storage (waveform reconstruction).

Given the measurement resolution is $T_s/M$, equivalent sampling rate of reconstructed waveform is M times original sample rate, i.e. $M/T_s$. That makes the data acquisition system having much higher equivalent sampling rate, and the equivalent sampling rate is irrelevant to the sampling rate of ADC, but concerned only to the measurement accuracy of time interval $t_i$, the higher equivalent sampling rate depends on the higher measurement accuracy of time interval $t_i$.

Figure 2:
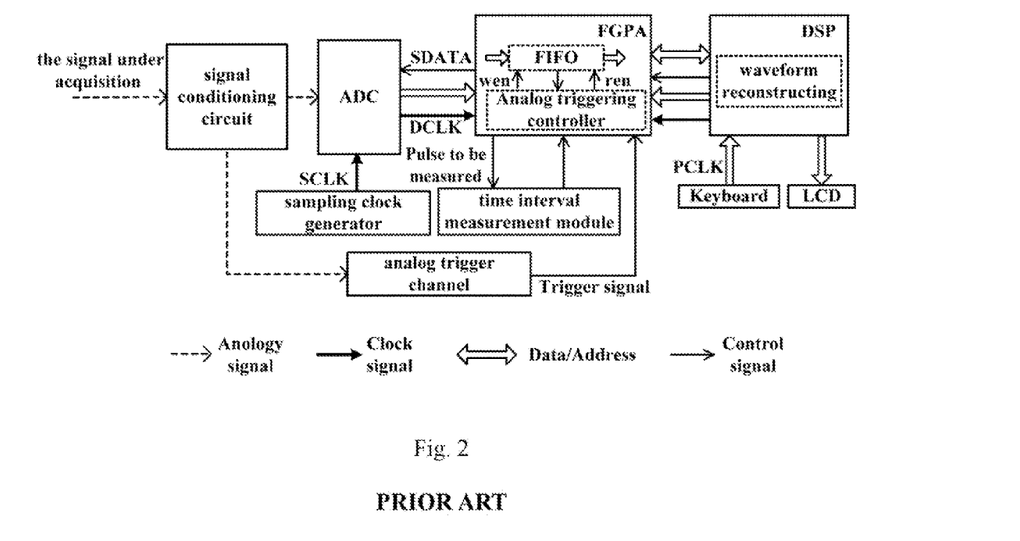
FIG. 2 is a functional block diagram of conventional random sampling system.

FIG. 2 is a functional block diagram of the random sampling system in prior art.

The conventional random sampling is realized on the basis of analog circuits and logic devices. As shown in FIG. 2, the conventional random sampling system comprises signal conditioning circuit, analog trigger channel, analog-to-digital converter (ADC), field programmable gate array (FPGA), digital signal processor (DSP), sampling clock generator, time interval measurement module, etc.

After conditioned by signal conditioning circuit, the signal under acquisition is sampled and quantized by ADC, and then the sampled data SDATA and synchronous clock DCLK is sent to FPGA. At the same time, the trigger is also sent from analog trigger channel to the FPGA. Every time when acquisition begins, the FPGA opens the writing enable wen to store a section (pre-triggering depth) of pre-triggering sampled data to the FIFO of FPGA, then opens reading enable ren to maintain the volume of pre-triggering sampled data with pre-triggering depth, waiting for triggering event. When the triggering event (e.g. rising or falling edge of the signal under acquisition) comes, the analog trigger channel sends a trigger signal to FPGA, and then FPGA closes reading enable ren, and generates a measurement pulse based on the time interval $t_i$ between trigger time $Tr_i$ of the $i^{th}$ acquisition and the first sampling time after the trigger of the $i^{th}$ acquisition. The measurement pulse is sent to the time interval measurement module for measuring. When the FIFO of FPGA attains sampled data up to the volume required, an acquisition is accomplished. FPGA closes writing enable wen, and calculates the corresponding address of the plurality of sampled data for back-end waveform display according to the result of time interval of the acquisition. The process of acquisition and time interval measurement is repeated multiple times, and multiple pluralities of sampled data are obtained. Each plurality of sampled data is stored according to the calculated corresponding address. The waveform reconstruction of data acquisition is realized based on stored sampled data. Considering the frequency irrelevance of the sampling clock and the signal under acquisition, the sampled data in FIFO can cover all locations after some time. As shown in lower part of FIG. 1, the signal under acquisition is completely reconstructed when displayed. The processes mentioned above are regulated by digital signal processor (DSP).

The aforementioned random sampling can solve the problem of high-frequency signal acquisition that cannot meet the Nyquist sampling theorem, but its hardware circuit is rather complicated. With regard to the signal under acquisition, which frequency is relatively not much higher comparing to the sampling clock, but required more specific waveform details, the random sampling mentioned above is dispensable.

SUMMARY OF THE INVENTION

The present invention aims to overcome the deficiencies of prior art and provides a method for full-digital random sampling to decrease the hardware complexity of data acquisition, and realize the data acquisition of signal with high sampling rate and more waveform details.

To achieve these objectives, in accordance with the present invention, a method for full-digital random sampling is provided, comprising the following steps:

(1) Random Sampling and Storing acquiring the sampled data of signal under acquisition by the ADC of random sampling system, wherein, the signal under acquisition varies monotonically before and after the trigger time, and in the monotonic section, a sampled data can be obtained before and after the trigger time respectively;

sending the sampling command randomly by controller of data acquisition system to open the writing enable (wen) of the FIFO (First In First Out) for storing sampled data from the ADC;

when pre-triggering depth $L_p$ of the FIFO is attained, opening the reading enable (ren) of the FIFO to maintain the volume of sampled data with depth $L_p$; meanwhile, detecting whether the sampled data is satisfied with the triggering condition, once satisfied, closing the reading enable (en) of the FIFO; and when the storage depth $L_s$ of an acquisition is attained, closing the writing enable (wen) of the FIFO; by this moment, the range of sampled data in the FIFO is $[d_{n-Lp+1}, d_{n+Ls-Lp}]$, where $1 \leq L_p \leq L_s$, the trigger is between the sampled data $d_n$ and $d_{n+1}$, where n is the position of the first sampled data before the trigger and n+1 is the position of the first sampled data after the trigger;

(2) Curve Fitting and Trigger Relocating fitting a curve on the basis of sampled data $d_n$ and $d_{n+1}$, the intersection point $Tr_L$ of triggering level $A_T$ and the fitted curve can be obtained, then calculating the time interval $t_L$ between sampled data $d_{n+1}$ and the intersection point $Tr_L$:

(3) Waveform Reconstructing according to step (1) and step (2), repeating the process of acquisition and time interval calculation, and multiple pluralities of sampled data $d_{ij}$ and the time interval $t_{Li}$ of each acquisition are obtained, where i is the acquisition serial number, i∈N, N is the number of acquisition, j is sampled data sequence number; then, interlacing the multiple pluralities of sampled data $d_{ij}$ by ascending order of the time interval $t_{Li}$ and storing the interlaced multiple pluralities of sampled data $d_{ij}$; in the end, reconstructing the original signal i.e. the signal under acquisition with the interlaced multiple pluralities of sampled data $d_{ij}$.

The objectives of the present invention are realized as follows:

For the signal under acquisition which varies monotonically before and after the trigger time, the present invention, i.e. method for full-digital random sampling employs the first sampled data ($d_n$) before the trigger time and the first sampled data ($d_{n+1}$) after the trigger time to fit a curve, and obtains a intersection point $Tr_L$ of triggering level $A_T$ and the fitted curve, then, calculates the time interval $t_L$ between sampled data $d_{n+1}$ and the intersection point $Tr_L$, in the end, reconstructs the original signal. i.e. the signal under acquisition by the time interval $t_{Li}$ of each acquisition. Thus, an analog trigger circuit and a rime measurement circuit of conventional random sampling system can be eliminated, that simplifies the circuit design of data acquisition system and decreases its hardware complexity. Moreover, the higher sampling rate for the signal under acquisition is attained, and more waveform details are obtained.

BRIEF DESCRIPTION OF THE DRAWING

The above and other objectives, features and advantages of the present invention will be more apparent from the following detailed description taken in conjunction with the accompanying drawings, in which.

DETAILED DESCRIPTION OF THE PREFERRED EMBODIMENT

Hereinafter, preferred embodiments of the present invention will be described with reference to the accompanying drawings. It should be noted that the similar modules are designated by similar reference numerals although they are illustrated in different drawings. Also, in the following description, a detailed description of known functions and configurations incorporated herein will be omitted when it may obscure the subject matter of the present invention.

Random sampling is a method that can enhance equivalent sampling rate effectively to obtain more details of a periodic signal. It repeatedly acquires the sampled data of a periodic signal at relatively lower sampling rate according to the irrelevance between the sampling clock and the signal under acquisition, and multiple pluralities of sampled data and the time interval of each acquisition are obtained. Then, it reconstructs the signal under acquisition with higher equivalent sampling rate according to the ordinal relations of the multiple pluralities of sampled data.

The present invention removes analog triggering channel and time interval measurement module from the conventional random sampling system, and uses digital signal processing (random sampling and storing, curve fitting and trigger relocating) to determine the ordinal relation of the multiple pluralities of sampled data for waveform reconstructing, in the end, reconstructs the original signal i.e. the signal under acquisition.

Figure 3:
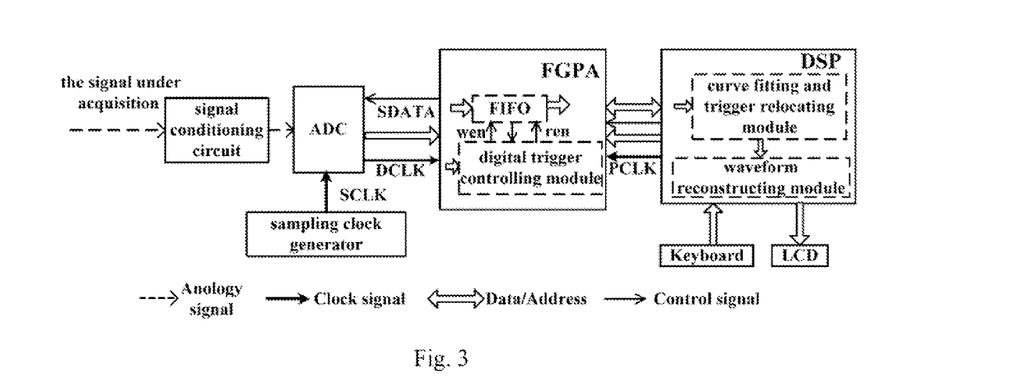
FIG. 3 is a functional block diagram of a random sampling system in accordance with the present invention.

FIG. 3 is a functional block diagram of a random sampling system in accordance with the present invention.

In one embodiment, as shown in FIG. 3, after conditioned by signal conditioning circuit, the signal under acquisition is sampled and quantized by ADC, and then the sampled data SDATA and synchronous clock DCLK is sent to FPGA. The sampled data SDATA is stored and processed in FPGA or DSP, which comprises random sampling and storing, curve fitting and trigger relocating, and waveform reconstructing. Comparing to FIG. 1, the random sampling system in accordance with present invention has eliminated the analog trigger channel and time interval measurement module. While, a digital trigger controlling module is added before the sampled data storage to generate an effective triggering signal, and curve fitting and trigger relocating module is added after the sampled data storage to find the ordinal relation of the multiple pluralities of sampled data. In the end, the reconstructing of the signal under acquisition can be realized.

In accordance with the present invention, the method for full-digital random sampling comprises the following steps: random sampling and storing, curve fitting and trigger relocating, and waveform reconstructing.

1. Random Sampling and Storing

Figure 4:
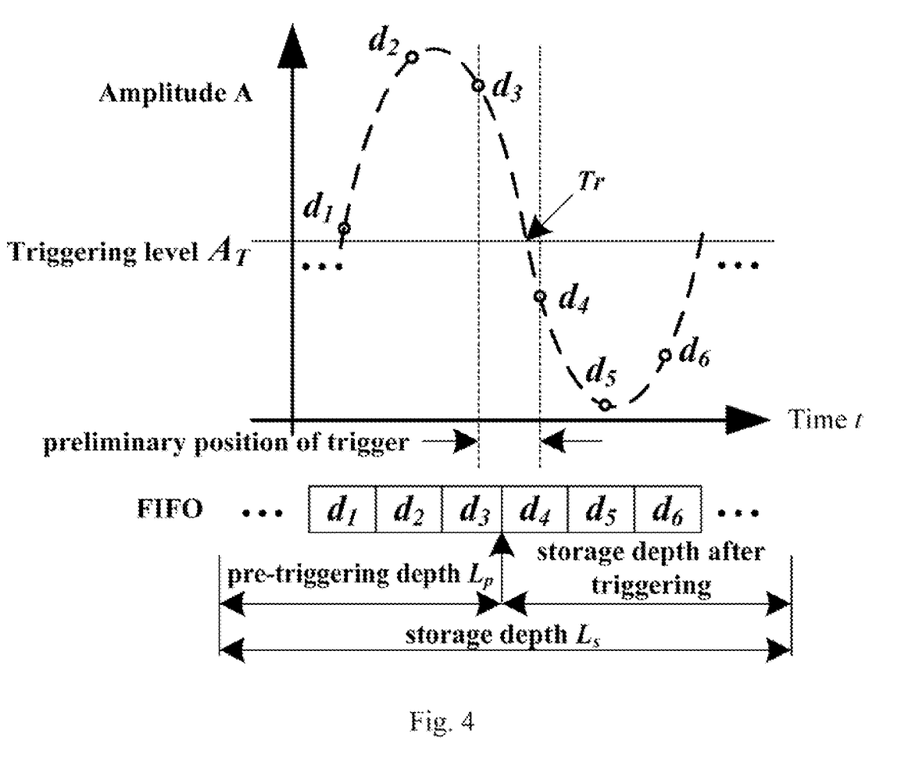
FIG. 4 is a diagram of digital triggering and storage controlling in accordance with the present invention.

Random sampling and storing consists of digital trigger controlling and sampled data storage, digital trigger controlling provides an important basis for sampled data storing. The principle of random sampling and storing is shown in FIG. 4.

In one embodiment of present invention. As the controller of data acquisition system. DSP sends the sampling command randomly, to open the writing enable (wen) of the FIFO (First in First Out) for storing sampled data from the ADC.

When pre-triggering depth $L_p$ of the FIFO is attained. DSP opens the reading enable (ren) of the FIFO to maintain the volume of sampled data with depth $L_p$; meanwhile, the digital trigger controlling module detects whether the sampled data is satisfied with the triggering condition. Assuming triggering level is $A_T$ and the triggering condition is a negative edge, so the criterion that sampled data $d_n$ and $d_{n+1}$ is satisfied with the triggering condition is:

$$d_n \geq A_T, \text{ and } d_{n+1} < A_T \qquad (1).$$

Similarly the triggering condition is a positive edge, the criterion that sampled data $d_n$ and $d_{n+1}$ is satisfied with the triggering condition is:

$$d_n \leq A_T, \text{ and } d_{n+1} > A_T \qquad (2).$$

Once satisfied, DSP closes the reading enable (ren) of the FIFO. And when the storage depth $L_s$ of an acquisition is attained. DSP closes the writing enable (wen) of the FIFO. By this moment, the range of sampled data in the FIFO is $[d_{n-Lp+1}, d_{n+Ls-Lp}]$, where $1 \leq L_p \leq L_s$. As shown in FIG. 4, the triggering condition is a negative edge, after searching and analyzing, the digital trigger controlling module can find that the trigger is between $d_3$ and $d_4$, where n=3, $d_3$ is the first sampled data before the trigger, $d_4$ is the first sampled data after the trigger, and the range of sampled data in the FIFO is $[d_{4-Lp}, d_{3+Ls-Lp}]$.

With the process of random sampling and storing mentioned above, not only the stored sampled data are satisfied with the storage depth, but also the preliminary position of trigger is obtained. And that lays the groundwork for the back end processing of sampled data.

2. Curve Fitting and Trigger Relocating

After the preliminary position of trigger is obtained, the signal under acquisition can be restored as accurately as possible through curve fitting on the basis of sampled data $d_n$ and $d_{n+1}$, the more accurate position of trigger can be obtained by trigger relocating. And that provides the parameter for reconstructing the signal under acquisition with higher equivalent sampling.

Figure 5:
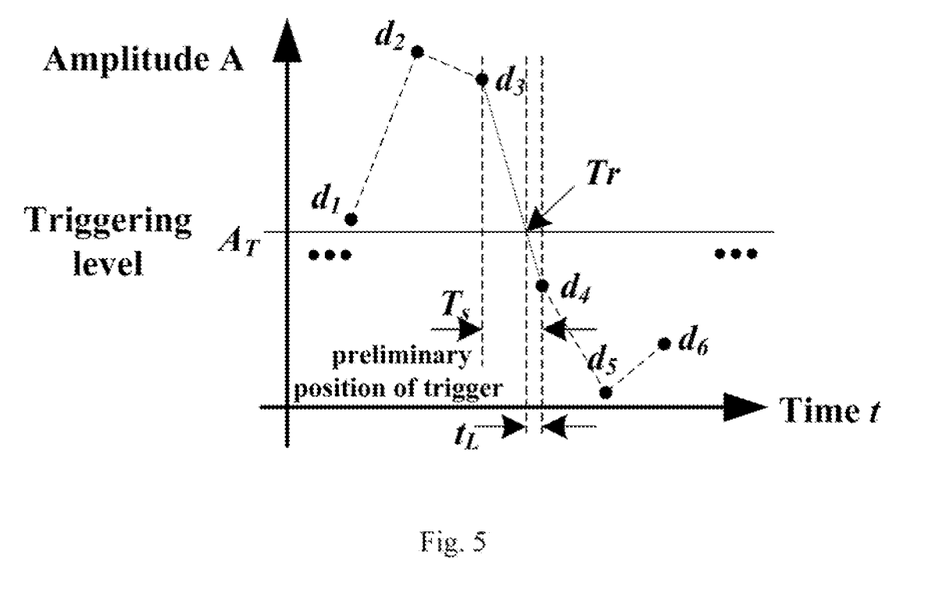
FIG. 5 is a diagram of trigger relocating based on linear fitting in accordance with the present invention.
Figure 6:
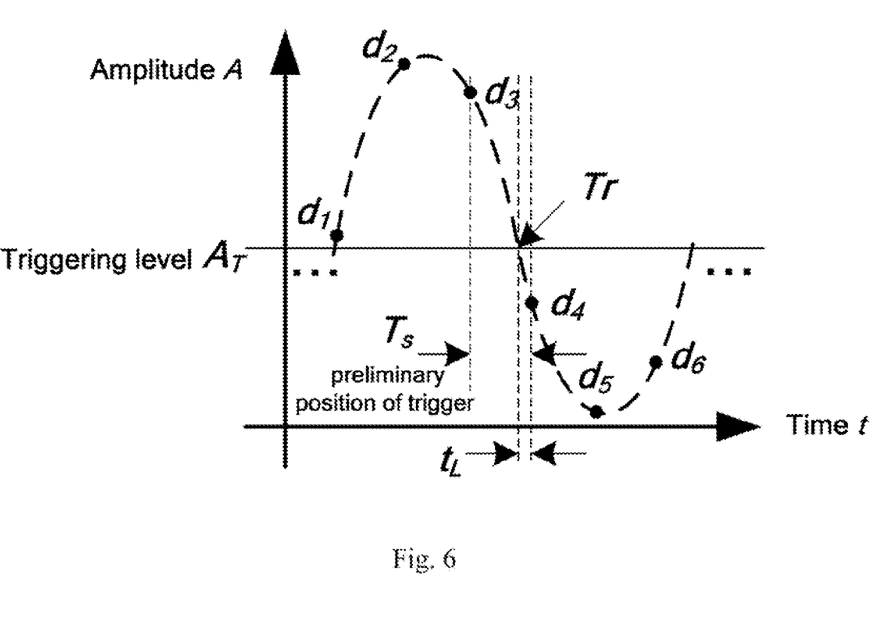
FIG. 6 is a diagram of trigger relocating based on sinusoidal fitting in accordance with the present invention.

The way of curve fitting depends on the specific characteristics of the signal under acquisition. The common ways involve linear fitting and sinusoidal fitting. As shown in FIG. 5 and FIG. 6. The more accurate position of trigger in sampled data is obtained through curve fitting on the basis of the preliminary position of trigger shown in FIG. 4.

FIG. 5 shows a diagram of trigger relocating based on linear fitting. Sampled data $d_3$ and $d_4$ are connected by a straight line, a intersection point $Tr_L$ of triggering level $A_T$ and the straight line, i.e. the fitted curve can be obtained. The time interval $t_L$ between sampled data $d_4$ and the intersection point $Tr_L$ is:

$$t_L = \frac{A_T - d_4}{d_3 - d_4} \cdot T_s; \qquad (3)$$

where $T_s$ is the sampling period of the ADC.

FIG. 6 shows a diagram of trigger relocating based on sinusoidal fitting. The model function of sinusoidal signal is $y = \alpha_x \sin(2\pi t/T_x + \Phi_x) + A_x$, where $\alpha_x, T_x, \phi_x, A_x$ and y represent amplitude, period, initial phase, DC offset and the amplitude of time t respectively. According to the model function of sinusoidal signal a equation is obtained as follows:

$$d_j = \alpha_x \cdot \sin(2\pi \cdot t_j/T_x + \phi_x) + A_x \qquad (4):$$

where $d_j$ is the jth sampled data, $t_j$ is jth sampling time. Thus a four-parameter sinusoidal fitting problem is obtained. According to parameter estimation method, we can get their estimated values $\tilde{a}_x, \tilde{T}_x, \tilde{\phi}_x$ and $\tilde{A}_x$. Therefore, the waveform expression after sinusoidal curve fitting is:

$$y = \hat{a}_x \cdot \sin(2\pi \cdot t/\hat{T}_x + \hat{\phi}_x) + \hat{A}_x. \qquad (5)$$

And the time of intersection point $Tr_L$ is $$t_T = \frac{\hat{T}_x}{2\pi} \arcsin[(A_T - \hat{A}_x)/\hat{a}_x],$$

thus the time interval $t_L$ between sampled data $d_4$ and the intersection point $Tr_L$ is:

$$t_L = 3T_x - t_T = 3T_s - \frac{\hat{T}_x}{2\pi} \arcsin[(A_T - \hat{A}_x)/\hat{a}_x]. \qquad (6)$$

Two kind of curve fitting and trigger relocating based on linear curve fitting and sinusoidal curve fitting are analyzed above. However, in practice, the ways of curve fitting and trigger relocating are not limited to the said ways, and different curve fitting mode can be employed due to different characteristics of signal under acquisition, so as more accurate position of trigger can be obtained.

3. Waveform Reconstructing

Repeating the process of acquisition and time interval calculation, and multiple pluralities of sampled data $d_{ij}$ and the time interval $t_{Li}$ of each acquisition are obtained. Therefore, we can reconstruct the signal under acquisition with higher equivalent sampling.

Supposing that equivalent sampling rate of reconstructed signal $f_0$ is M times the sampling rate of ADC $f_s$, the time resolution of reconstructed signal is $\Delta t = T_s/M$. Meanwhile, the digital trigger interval is divided into M subintervals $[\Delta t \cdot (k-1), \Delta t \cdot k)$, where k=1, 2, ..., M. Then, the position $k_i$ of the $i^{th}$ storage of sampled data meets the condition:

$$t_{Li} \in [T_s \cdot (k_i - 1)/M, T_s \cdot k_i/M) \qquad (7).$$

Figure 7:
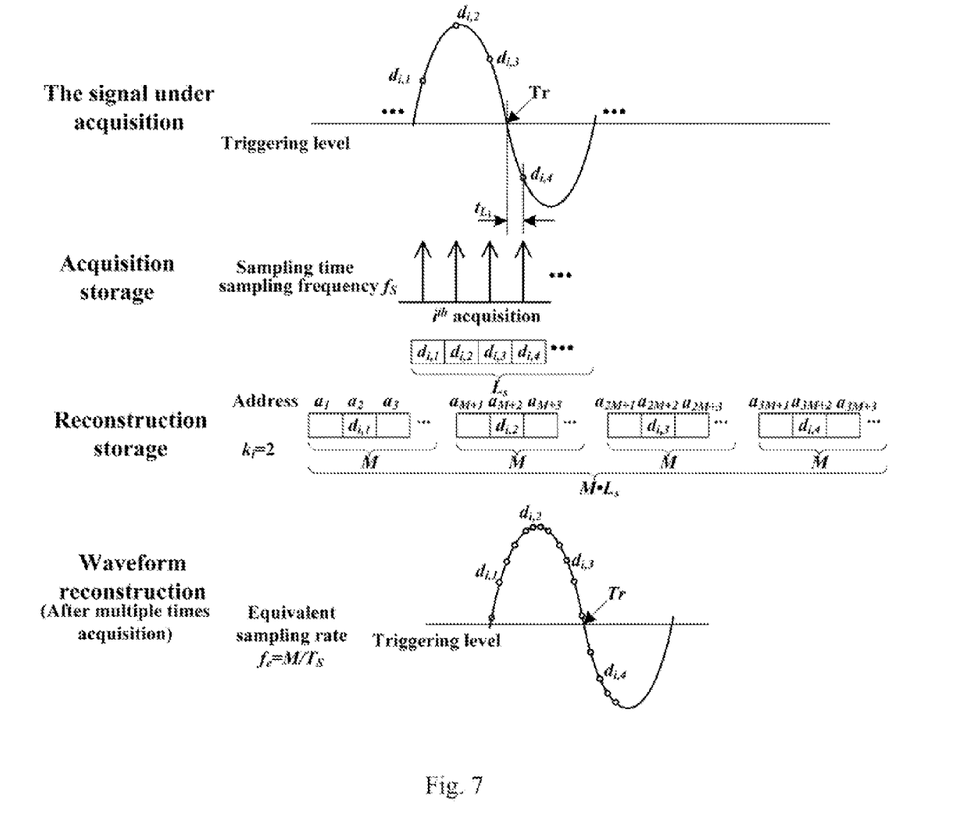
FIG. 7 is a diagram of the processing of sampled data (the signal under acquisition is sinusoidal wave) in accordance with the present invention.

For example, if the time interval $t_{Li}$ of $i^{th}$ acquisition satisfies the equation (7), then the address of the plurality of sampled data are $\alpha_{j-M+k_i}$, which is shown in FIG. 7, where $k_i$=2. i.e. as a set of M successive addresses, the sample data in $i^{th}$ acquisition is stored in the $2^{nd}$ address and so forth. Therefore, time intervals $t_{Li}$ are sorted by the ascending order so as to interlace and recombine the data $d_{ij}$ from each acquisition successively.

Figure 8:
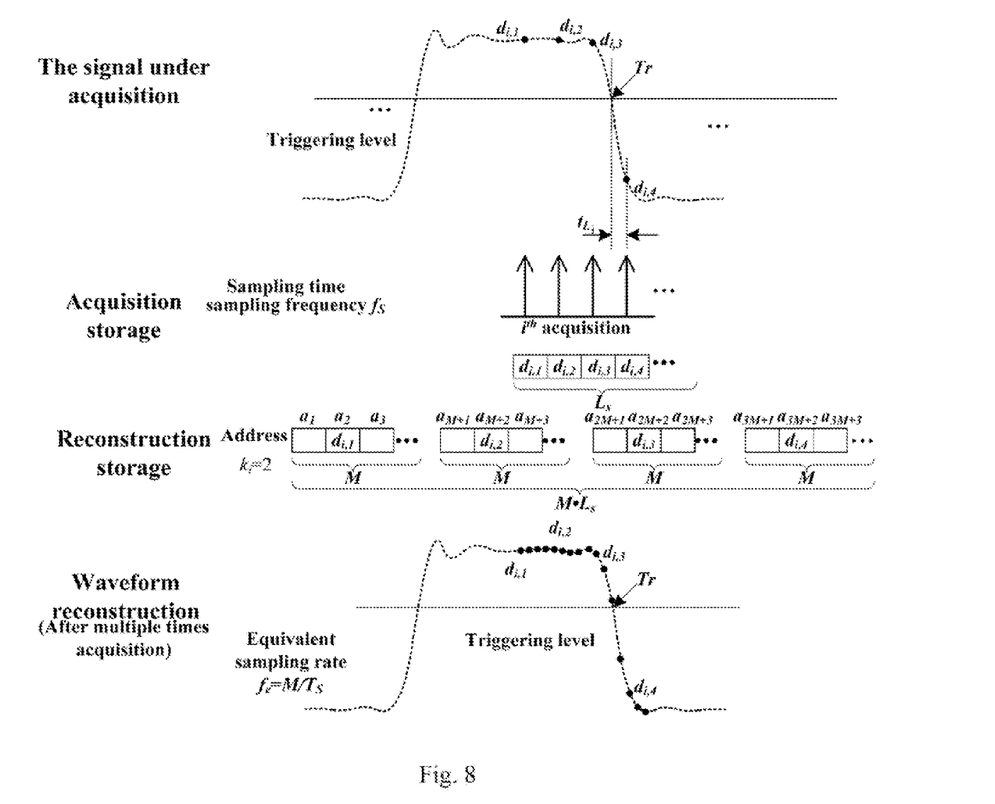
FIG. 8 is another diagram of the processing of sampled data (the signal under acquisition is square wave) in accordance with the present invention.

FIG. 8 shows another diagram of the processing of sampled data. The signal under acquisition is square wave. The random sampling is similar to FIG. 7. The sampling rate is enhanced dramatically, and more accurate reconstructed signal is obtained.

After the aforementioned analysis, the key to present invention is the accuracy of trigger relocating and, in practice, it is determined by the accuracy of curve fitting. However, the accuracy of curve fitting is correlated with the jitter of sampling clock edge. Thus the data acquisition system needs sampling clock with lower jitter to acquire high resolution sampled data.

In the embodiment mentioned above, sinusoidal fitting and linear fitting are employed for trigger relocating, which has a significant effect on enhancing equivalent sampling rate when the signal under acquisition varies monotonically near the trigger. With regard to more complicated signal under acquisition, we should use more precise curve fitting method such as fuzzy matching, neural network, etc to enhance the accuracy of trigger relocating, in the end, to enhance the equivalent sampling rate.

SUMMARIZATION

The innovation of the present invention lies in: (i) overcoming the deficiencies of conventional random sampling in prior art by full-digital processing, i.e. high hardware performance and complicated structure: (ii) providing an effective way to relocate the trigger through curve fitting. The present invention is now applied only to the signal which vanes monotonically near the trigger, yet new research orientation on full-digital random sampling is exploited, and a new pathway on signal feature extraction for data postprocessing is proposed.

While illustrative embodiments of the invention have been described above, it is, of course, understand that various modifications will be apparent to those of ordinary skill in the art. Such modifications are within the spirit and scope of the invention, which is limited and defined only by the appended claims.

What is claimed is:

1. A method for full-digital random sampling, the method comprising the following steps:
   (1). Acquisition of Sampled Data
      acquiring sampled data of a signal by an analog-to-digital converter (ADC) of a random sampling system, the signal under acquisition varying monotonically before and after a trigger time, and in a monotonic section of the signal, a sampled data can be obtained before and after the trigger time respectively;
      sending a sampling command randomly by a controller of a data acquisition system to open a writing enable (wen) of a FIFO (First In First Out) for storing sampled data from the ADC;
      when attaining a pre-triggering depth $L_p$ of the FIFO:
         opening a reading enable (ren) of the FIFO to maintain a volume of sampled data with depth $L_p$;
         detecting whether the sampled data is satisfied with a triggering condition; and
         if the sampled data satisfies the triggering condition, closing the reading enable (ren) of the FIFO; and
      when attaining a storage depth $L_s$;
         closing the writing enable (wen) of the FIFO such that a range of sampled data in the FIFO is $[d_{n-L_p+1}, d_{n+L_s-L_p}]$, where $1 \leq L_p \leq L_s$, the trigger being between a sampled data $d_n$ and $d_{n+1}$, where n is the position of a first sampled data before the trigger and n+1 is the position of the first sampled data after the trigger;
   (2). Time Interval Calculation
      fitting a curve based on the sampled data $d_n$ and $d_{n+1}$, obtaining a intersection point $Tr_L$ of a triggering level $A_T$ and the fitted curve, and calculating a time interval $t_L$ between sampled data $d_{n+1}$ and the intersection point $Tr_L$;
   (3). Waveform Reconstruction
      according to step (1) and step (2), repeating the process of acquisition and time interval calculation, and obtaining multiple pluralities of sampled data $d_{ij}$ and time intervals $t_{Li}$ of each acquisition, where i is a acquisition serial number, i∈N, N is a number of acquisitions, j is sampled data sequence number;
      interlacing the multiple pluralities of sampled data $d_{ij}$ by ascending order of the time interval $t_{Li}$, and storing the interlaced multiple pluralities of sampled data $d_{ij}$; and,
      reconstructing the signal under acquisition with the interlaced multiple pluralities of sampled data $d_{ij}$.

2. The method for full-digital random sampling of claim 1, wherein the triggering level is $A_T$, such that:
   if the triggering condition is a negative edge, the criterion that sampled data $d_n$ and $d_{n+1}$ satisfies the triggering condition is:

$d_n \geq A_T$, and $d_{n+1} < A_T$; and if the triggering condition is a positive edge, the criterion that sampled data $d_n$ and $d_{n+1}$ satisfies the triggering condition is:

$d_n \leq A_T$, and $d_{n+1} > A_T$.

3. The method for full-digital random sampling of claim 1, wherein the curve is fitted by a method of linear fitting or sinusoidal fitting.

* * * * *